Figure 1:
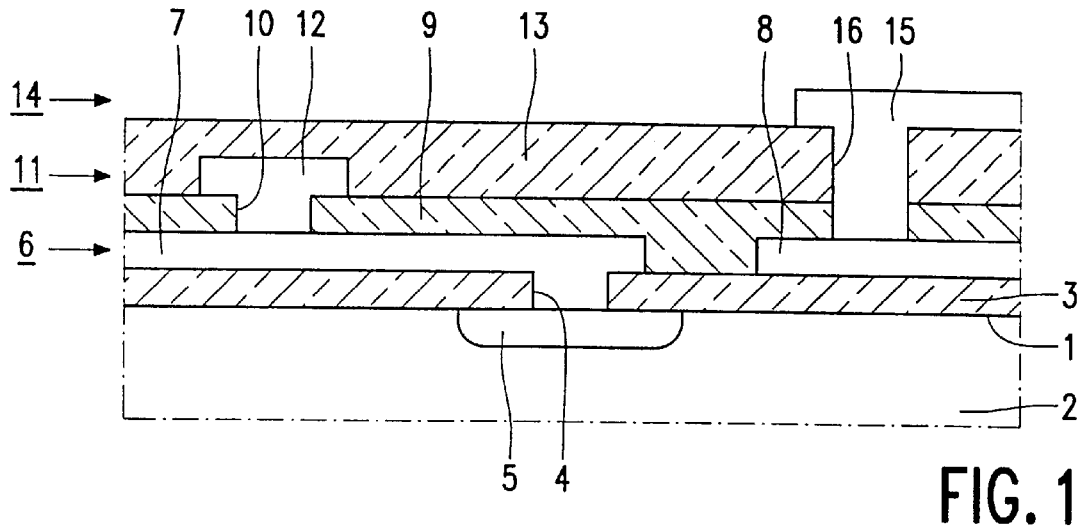
Figure 2:
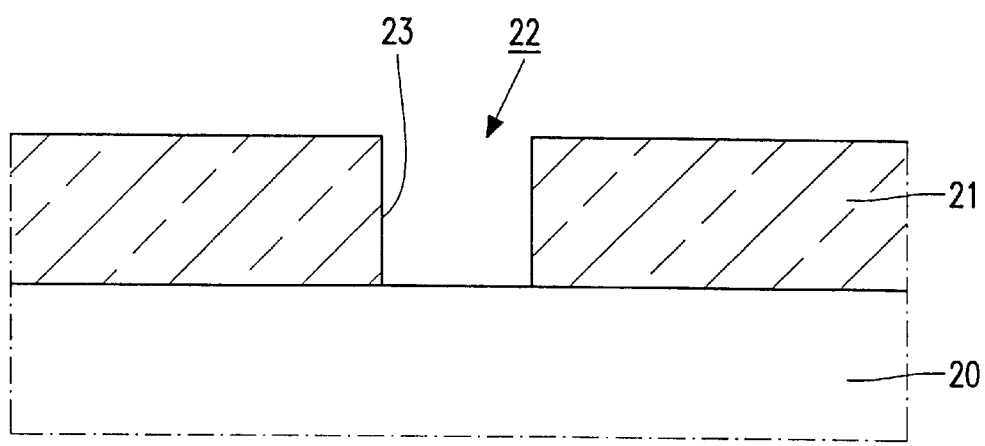

United States Patent

Webster et al.

Patent Number: 6,143,651
Date of Patent: Nov. 7, 2000

[54] METHOD OF MANUFACTURING A SEMICONDUCTOR DEVICE WITH A MULTILAYER WIRING

[75] Inventors: Marian N. Webster; Albertus G. Dirks, both of Eindhoven, Netherlands

[73] Assignee: U.S. Philips Corporation, New York, N.Y.

[21] Appl. No.: 09/062,945

[22] Filed: Apr. 20, 1998

[30] Foreign Application Priority Data

Apr. 28, 1997 [EP] European Pat. Off. .............. 97201274

[51] Int. Cl.[7] .................................................. H01L 21/44
[52] U.S. Cl. .......................................... 438/660; 438/688
[58] Field of Search .................................... 438/607, 646, 438/661, 622, 629, 648, 683, 687, 644, 637, 675, 660, 688; 257/764, 765, 767, 770, 771, 751

[56] References Cited

U.S. PATENT DOCUMENTS

| | | | |
|---|---|---|---|
| 5,136,362 | 8/1992 | Grief et al. | 357/67 |
| 5,418,187 | 5/1995 | Miyanaga et al. | 437/194 |
| 5,459,353 | 10/1995 | Kanazawa | 257/751 |
| 5,508,066 | 4/1996 | Akahori | 427/571 |
| 5,523,626 | 6/1996 | Hayashi et al. | 257/763 |
| 5,864,179 | 1/1999 | Koyama | 257/767 |
| 5,883,433 | 3/1999 | Oda | 257/750 |

OTHER PUBLICATIONS

Bunshah, R.F., et al, Deposition Technologies for Films and Coatings: Developments and Applications, Noyes Publications, Park Ridge, New Jersey, USA, pp. 183, 192,211–212, 1982.

*Primary Examiner*—Benjamin L. Utech
*Assistant Examiner*—Matthew Anderson
*Attorney, Agent, or Firm*—Brian J. Wieghaus

[57] ABSTRACT

A method of manufacturing a semiconductor device with a multilayer wiring (6, 11, 14) with aluminum conductor tracks (7, 12, 15) which are insulated from one another by insulating layers (9, 13). According to the method, an aluminum conductor track (20) provided on a surface (1) of a semiconductor body (2) is covered with a layer of insulating material (21), whereupon a contact window (22) with a wall (23) reaching down to the conductor track is formed in this insulating layer. A conductive intermediate layer (24, 28) and an aluminum layer (25, 29) are provided on this wall, whereupon a heat treatment is carried out such that aluminum (26) grows from the conductor track into the contact window. A conductive intermediate layer of titanium is provided on the wall of the contact window. A very thin, closed aluminum layer, which remains closed also during the heat treatment, can be formed on this titanium layer, which can be provided on the wall with a small thickness. The method is accordingly suitable for making semiconductor devices with multilayer wirings having contact windows of 0.5 μm or smaller and having aspect ratios above 1.

12 Claims, 4 Drawing Sheets

METHOD OF MANUFACTURING A SEMICONDUCTOR DEVICE WITH A MULTILAYER WIRING

The invention relates to a method of manufacturing a semiconductor device with a multilayer wiring whereby an aluminum conductor track is formed on a surface of a semiconductor body, which conductor track is covered with a layer of insulating material, whereupon a contact window is formed in said insulating layer with a wall which reaches down to the conductor track and on which a conductive intermediate layer and an aluminum layer are provided, and a heat treatment is carried out such that aluminum grows from the conductor track into the contact window.

An aluminum conductor track is here understood to be a conductor track which is formed, for example, by etching of a layer of aluminum deposited on the surface of the semiconductor body. Alternatively, the conductor track may be formed through the etching of a groove into an insulating layer and filling of this groove with aluminum. The aluminum may here comprise a small quantity of silicon or copper or silicon and copper.

Multilayer wirings made of aluminum are used in semiconductor devices which comprise many semiconductor elements. When the number of semiconductor elements in semiconductor devices (VLSI) is increased, the dimensions of the conductor tracks and contact windows to be realized become increasingly smaller. The thickness of the insulating layer does not change very much. The depth/diameter ratio, also called aspect ratio, thus increases continuously. Filling of the contact windows with aluminum is found to be practically impossible in the case of diameters of less than 1 $\mu$m and an aspect ratio of more than 1. The contact windows are then often filled with a different metal such as, for example, tungsten. In the method mentioned in the opening paragraph, aluminum grows from the conductor track into the contact window during the heat treatment. The contact window can thus be filled at least partly from the aluminum conductor track situated below the insulating layer. A conductor track of a next wiring layer to be formed on the insulating layer will thus be capable of making contact more easily with the former conductor track. The method mentioned in the opening paragraph thus appears to be suitable for filling small contact windows with aluminum.

U.S. Pat. No. 5,418,187 discloses a method of the kind mentioned in the opening paragraph whereby a conductive intermediate layer of titanium nitride is provided on the wall of the contact window. The contact window has a diameter of 1.2 $\mu$m and a depth of 0.8 $\mu$m. After a 200 nm thick layer of aluminum has been deposited on the titanium nitride provided on the contact window wall, the heat treatment is carried out at 500° C. in an argon atmosphere at a pressure of $10^{-3}$ to $10^{-7}$ torr, such that aluminum grows from the conductor track situated below the insulating layer into the contact window. The aluminum layer deposited on the wall may be etched away from the conductor track within the contact window prior to the heat treatment.

It is found in practice that contact windows having a diameter of 1.2 $\mu$m and an aspect ratio of 0.65 can be filled with aluminum from the conductor track situated below the insulating layer in this manner. This known method, however, is not suitable for filling contact windows having a diameter of 0.5 $\mu$m and smaller and having a higher aspect ratio.

The invention has for its object to improve the method mentioned in the opening paragraph such that also contact windows having a diameter of less than 0.5 $\mu$m can be filled with aluminum from the conductor track situated below the insulating layer. The method is for this purpose characterized in that a conductive intermediate layer of titanium is provided on the wall of the contact window.

The invention is based on the recognition that the growth of the aluminum from the conductor track situated below the insulating layer takes place through surface diffusion via the aluminum layer present on the wall of the window during the heat treatment. It is accordingly necessary for the aluminum layer on the contact window wall to remain closed during the growing process. The moment this layer is interrupted, the growing process will stop and voids will arise in the aluminum in the contact window. The measure according to the invention, whereby a conductive intermediate layer of titanium is provided on the wall of the contact window, achieves that a closed aluminum layer with a thickness of less than 30 nm can be formed. It is found that a closed aluminum layer of such a small thickness can be provided on the titanium layer.

The titanium reacts with the wall of the contact window during the deposition of titanium, whereby a good adhesion is created by chemical bonds. The aluminum layer reacts with the subjacent titanium during the heat treatment, whereby a boundary layer of $Al_3Ti$ is formed. A good adhesion also arises between the aluminum layer and the titanium layer owing to chemical bonds. Interruptions in the closed aluminum layer are thus strongly counteracted during the heat treatment.

Contact windows having a diameter of less than 0.5 $\mu$m and an aspect ratio of two or more can be filled in the manner described because the use of the titanium intermediate layer renders it possible to provide such a thin, closed aluminum layer, which in addition does not crack during the heat treatment.

If an intermediate layer of titanium nitride is used on the wall of the contact window, as in the known method, a comparatively thick aluminum layer must be provided in order to obtain a closed layer. Titanium nitride adheres less well to the contact window wall in practice than does titanium. The aluminum does not react with the titanium nitride layer often used as a barrier layer, so that the chemical bonds mentioned above are absent. As a result, a thin, closed aluminum layer can easily crack during the heat treatment. In the known method described earlier, an aluminum layer with a thickness of 200 nm is provided on the wall of a contact window, which has a diameter of 1.2 $\mu$m. A layer of such a thickness will remain closed during the heat treatment. In practice, such a thick layer of aluminum can be formed on the walls of contact windows having a diameter of 1.2 $\mu$m or more, but this is not possible on the walls of contact windows having a diameter of less than 0.5 $\mu$m.

Preferably, the conductive intermediate layer of titanium is provided on the wall of the contact window to a minimum thickness of 1 nm. The wall of the contact window is entirely covered with a closed titanium layer then, on which the closed aluminum layer mentioned above can be formed with said good adhesion. The wall of the contact window is not covered with a layer of equal thickness over its entire height in the deposition of titanium in contact windows by means of usual sputter deposition processes. This layer is practically as thick as the layer deposited on the surface of the insulating layer in the upper portion of the contact window, but the layer is thinner in the lower portion of the contact window. The ratio of these thicknesses is the so-called step covering. This is dependent on the aspect ratio of the contact window in usual processes. Given an aspect ratio of 2.5, the step covering may be only 20%, and no more than 10% for a window with an aspect ratio of 6.5. To obtain the desired minimum thickness of 1 nm, accordingly, it may be necessary to deposit 10 nm of titanium. The layer is then also 10 nm thick in the upper portion of the window. This thickness, however, is small compared with the diameter of the contact window to be filled.

After the contact window has been formed in the insulating layer, a titanium layer can be deposited. This layer is then formed on the insulating layer, on the wall of the contact window, and on the bottom of the contact window. The titanium may then be removed from the insulating layer and from the bottom of the contact window in a usual anisotropic etching treatment, so that a titanium layer remains only on the wall of the contact window. This etching treatment, however, is preferably omitted because it involves an additional process step. The thin, conductive intermediate layer of titanium is accordingly preferably provided not only on the wall of the contact window, but also on the exposed conductor track in the contact window, the titanium layer being provided on the conductor track to a thickness of at most 10 nm. The titanium reacts with the aluminum of the conductor track on the bottom of the contact window during the heat treatment. Since the titanium layer on the bottom of the contact window is less than 10 nm thick, separate $Al_3Ti$ particles are formed. These do not interfere with the growth of the aluminum from the conductor track. The electrical resistance between the conductor track and a second aluminum layer connected herewith is not substantially increased by these particles either.

Preferably, a second aluminum layer is deposited during the heat treatment, in which a conductor track is formed which lies on the insulating layer and which is connected to the conductor track situated below the insulating layer via the contact window. Two process steps are combined in this manner. The measure has the additional advantage that during the heat treatment aluminum does not only grow into the contact window from the conductor track lying below the insulating layer, but is also supplied from above. The contact window is more quickly filled in this way. This achieves not only a saving in time, but also a reduction of the risk of cracks arising in the closed aluminum layer on the wall of the contact window.

A time saving is also achieved in that the deposition of the aluminum layer on the wall of the contact window and the deposition of the second aluminum layer are carried out in immediate succession in one and the same reactor chamber. The substrates need not be transferred from one reactor chamber to another. The two deposition processes are carried out at reduced pressure, so that it is also prevented that a reactor chamber is to be brought to a low pressure twice. Moreover, pollution of the substrates is counteracted.

If the semiconductor body is heated to a temperature of at most 150° C. during the deposition of the aluminum layer on the wall of the contact window, it is achieved that a very thin, closed aluminum layer is formed on the titanium. A total thickness of titanium plus aluminum of less than 50 nm can be realized in this way at the upper portion of the contact window. The method is accordingly suitable for filling contact windows having a diameter of less than 0.5 $\mu$m and an aspect ratio of more than 1.

If the temperature of the semiconductor body is increased to a maximum lying between 450° C. and 500° C., for example within 35 s, immediately after the deposition of the aluminum layer on the wall of the contact window, and this temperature is maintained for a period of 30 to 50 s, the process of filling the contact window during the deposition of the second aluminum layer will proceed so quickly that the risk of cracks arising in the closed aluminum layer on the contact window wall is reduced even further.

Figure 8:
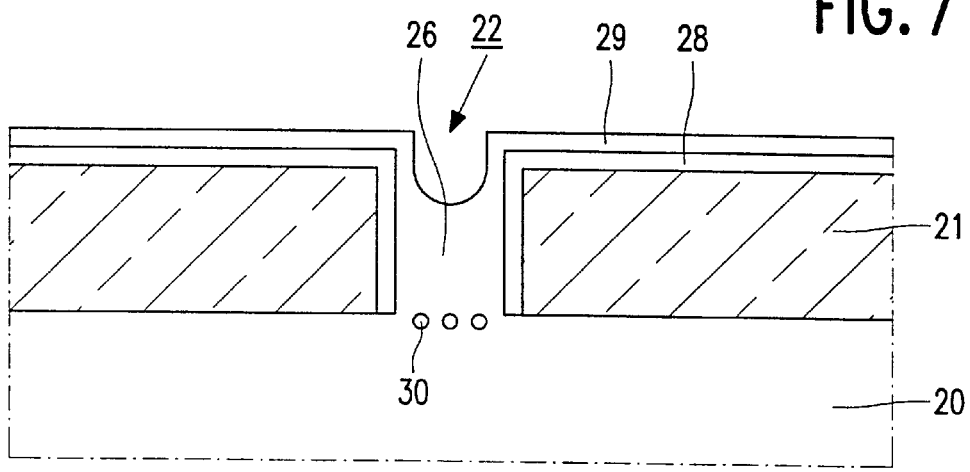
Figure 9:
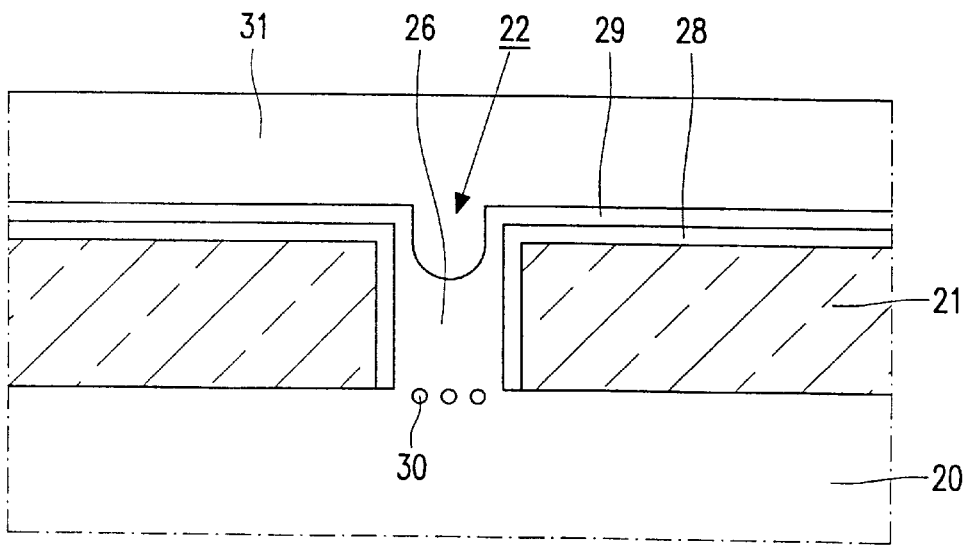
Figure 10:
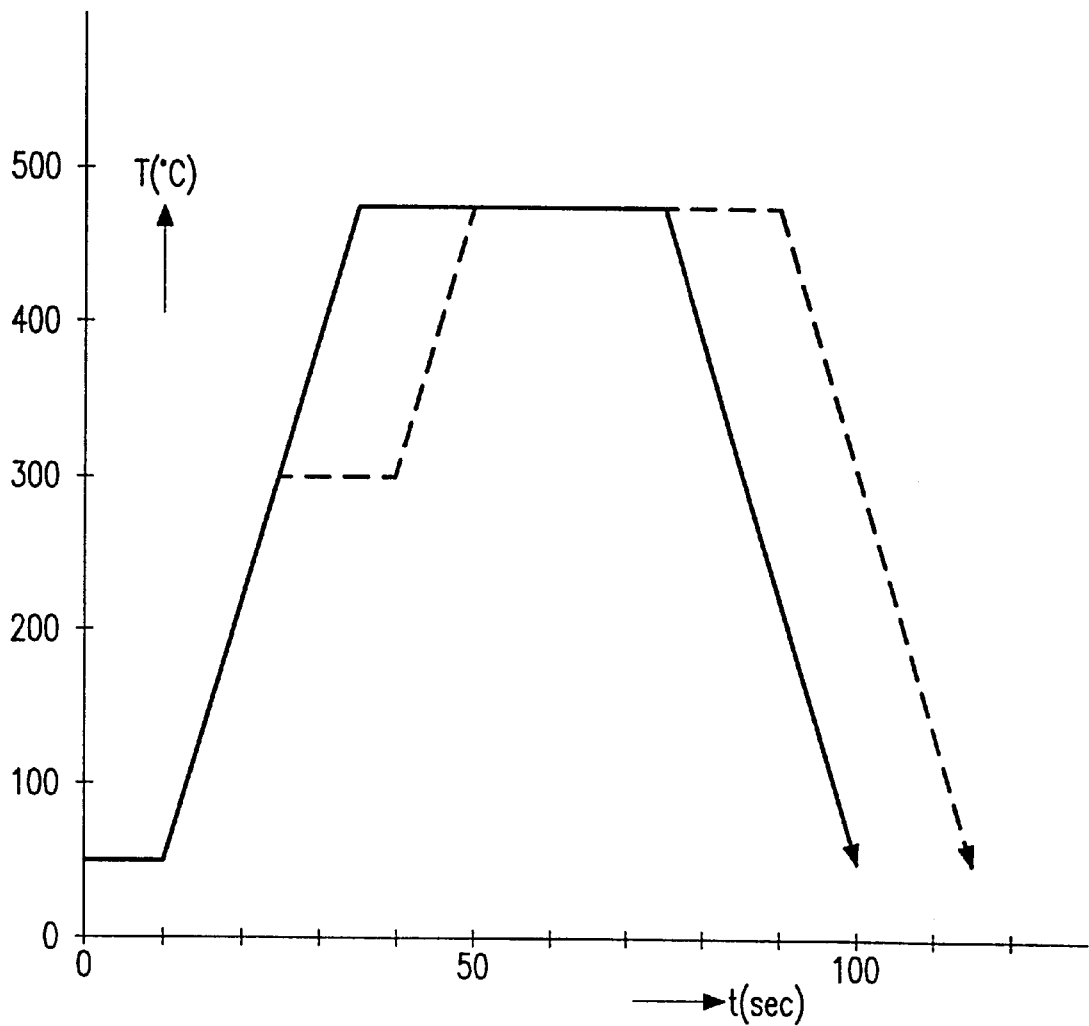

The invention will be explained in more detail below by way of example with reference to a drawing, in which:

FIG. 1 is a diagrammatic cross-section of a semiconductor device having a multilayer wiring, FIGS. 2, 3, 4, 5 diagrammatically and in cross-section show a few stages in the manufacture of a semiconductor device by a first embodiment of the method according to the invention, FIGS. 6, 7, 8, 9 diagrammatically and in cross-section show a few stages in the manufacture of a semiconductor device by a second embodiment of the method according to the invention, and FIG. 10 plots the temperature gradient of the semiconductor body during the implementation of the method according to the invention.

FIG. 1 diagrammatically and in cross-section shows a semiconductor device with a multilayer wiring. A first insulating layer 3 is formed on a surface 1 of a semiconductor body 2, a silicon wafer in the example. Contact windows, within which semiconductor zones formed in the semiconductor body 2 are exposed, are provided in this insulating layer 3. The drawing shows the contact window 4 as an example, within which the semiconductor zone 5 is exposed. A first wiring layer 6, of which the conductor tracks 7 and 8 are shown in the Figure, is formed on the first insulating layer 3. The conductor track 7 is connected to the semiconductor zone 5. A second insulating layer 9 is formed on this first wiring layer 6 and is provided with contact windows, of which the contact window 10 is shown. A second wiring layer 11, of which a conductor track 12 is shown, is formed on the second insulating layer 9. This conductor track 12 is connected to the conductor track 7 of the first wiring layer 6. A third insulating layer 13, on which a third wiring layer 14 is provided, is formed on the second wiring layer 11. Of this third wiring layer 14, the conductor track 15 is shown, which is connected to the conductor track 8 of the first wiring layer 6 via a contact window 16 which is provided in the third insulating layer 13 and in the second insulating layer 9.

The first, second, and third insulating layers, 3, 9, 13 are silicon oxide layers which are formed in a usual manner. The contact windows 4, 10, 16 are etched therein. The wiring layers 6, 11, 14 are formed in aluminum layers into which the conductor tracks 7, 8, 12 and 15 are etched. The aluminum may here comprise a small quantity of silicon or copper, or silicon and copper. It is usual to add to the aluminum, for example, 1 at % silicon and 0.5 at % copper.

Figure 3:
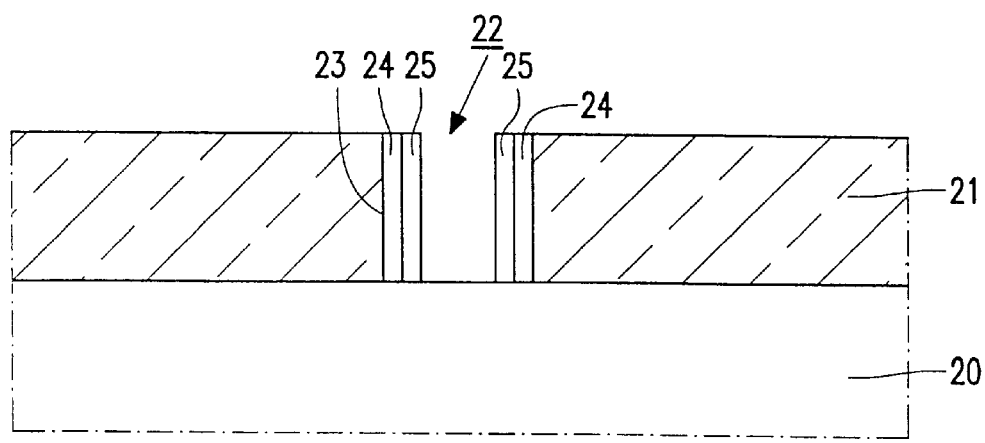
Figure 4:
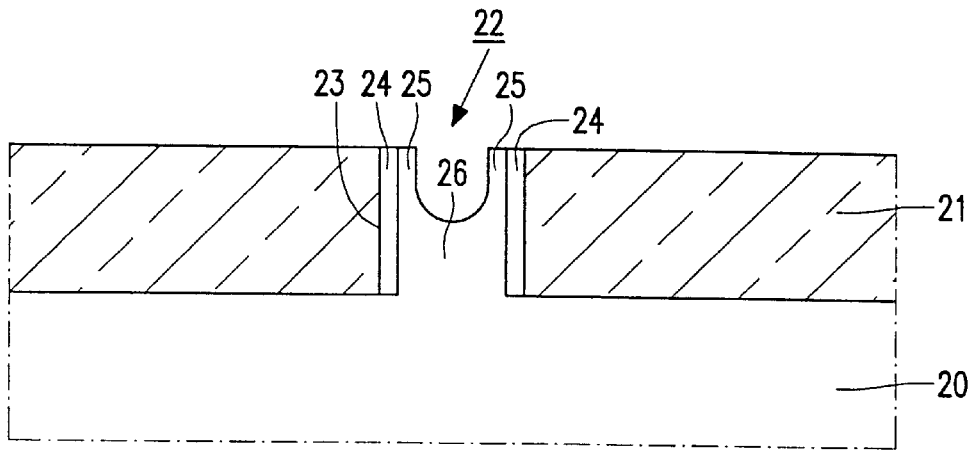
Figure 5:
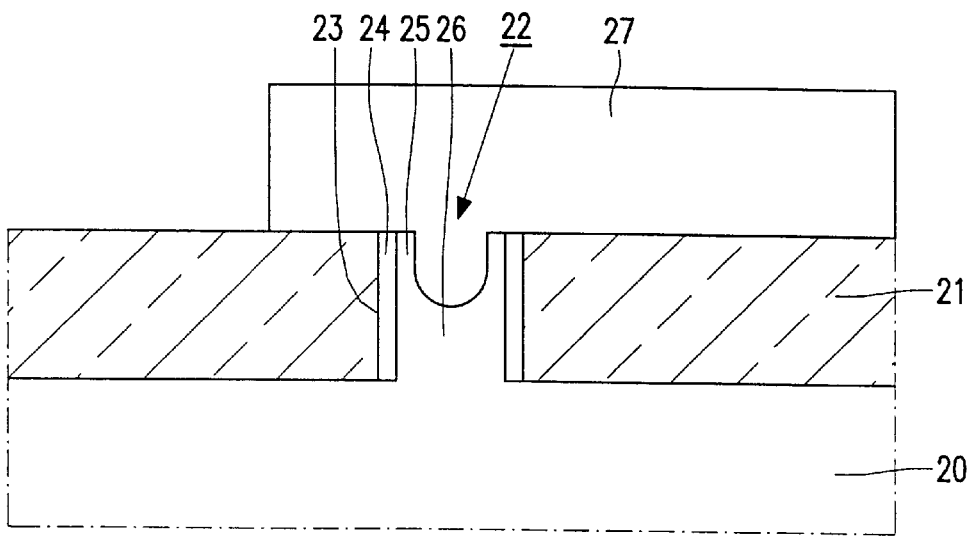
Figure 6:
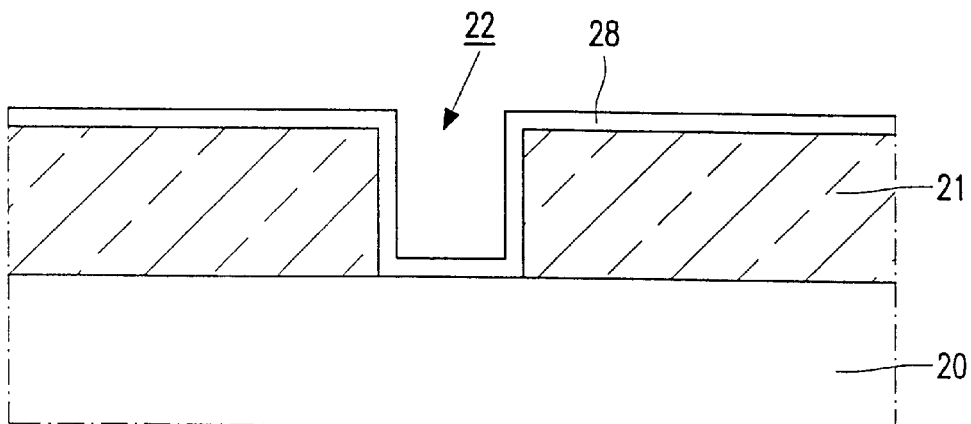

Only one aluminum conductor track 20 is shown in the FIGS. 2–9 for simplicity's sake, which track is covered with a layer of insulating material 21. A contact window 22 with a wall 23 reaching down to the conductor track 20 is formed in the insulating layer 21. A conductive intermediate layer 24 and an aluminum layer 25 are provided on the wall 23, as shown in FIG. 3, whereupon a heat treatment is carried out such that aluminum 26 grows from the conductor track 20 into the contact window 22, as shown in FIG. 4.

According to the invention, a conductive intermediate layer 24 of titanium is provided on the wall 23 of the contact window 22. This takes place by means of a usual sputter deposition process in this example. While the layer of titanium 24 is being deposited, the titanium reacts with the silicon oxide present at the wall 23 of the contact window 22, so that a good adhesion between the titanium layer 24 and the wall 23 is created owing to chemical bonds. The titanium may be removed from the insulating layer 21 and from the bottom of the contact window 22 after its deposition by means of a usual anisotropic etching treatment. Preferably, however, the intermediate layer 24 is maintained in its entirety in this stage.

The aluminum layer 25 is also provided in a usual sputter deposition process. Since the aluminum layer 25 is provided on a titanium layer 24, it is possible to form a closed aluminum layer with a thickness of less than 30 nm. The aluminum layer reacts with the subjacent titanium during the heat treatment, a boundary layer of $Al_3Ti$ being formed. As a result, a good adhesion caused by chemical bonds also arises between the aluminum layer and the titanium layer. The closed aluminum layer 25 is found to remain closed during the heat treatment. This is indeed necessary because the growth of the aluminum 26 from the conductor track 20 situated below the insulating layer 21 takes place through surface diffusion along the aluminum layer 25 present on the wall 23 of the window 22 during the heat treatment. The growing process will stop the moment the layer of aluminum 25 is interrupted.

Contact windows with diameters of less than 0.5 $\mu$m and an aspect ratio of 1 or more can be filled by growing of aluminum 26 from the conductor track 20 because the use of the intermediate layer 24 of titanium renders it possible to provide such a thin, closed aluminum layer 25, which in addition does not become cracked during the heat treatment.

The conductive intermediate layer 24 of titanium is provided on the wall 23 of the contact window 22 to a minimum thickness of 1 nm. The wall 23 of the contact window 22 is then entirely covered by a closed titanium layer on which said closed aluminum layer can be formed with said good adhesion. The wall of the window is not covered with a layer of equal thickness over its entire height during the deposition of titanium in contact windows by means of usual sputter deposition processes. This layer is practically as thick as the layer deposited on the surface of the insulating layer in the upper portion of the contact window, while in the lower portion of the contact window the layer is thinner. The ratio of these thicknesses is the so-called step covering. This is dependent on the aspect ratio of the contact window in usual processes. Given an aspect ratio of 2.5, the step covering may be only 20%, and no more than 10% for a window having an aspect ratio of 6.5. To obtain the desired minimum thickness of 1 nm, accordingly, it may be necessary to deposit 10 nm titanium. The layer will then be 10 nm thick also in the upper portion of the window. This thickness, however, is small compared with the diameter of the contact window to be filled.

Figure 7:
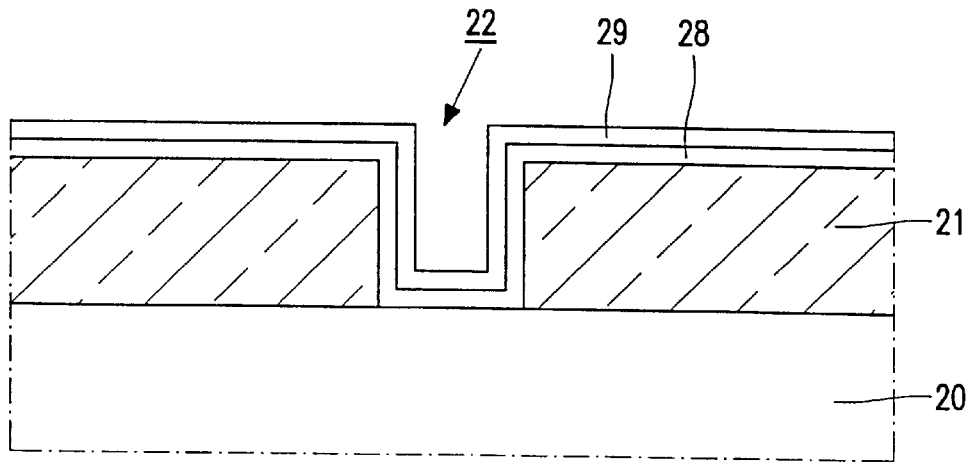

The titanium layer 24 on the wall 23 of the contact window 22 may be formed through deposition of a titanium layer after the formation of the contact window 22 in the insulating layer 21. This titanium layer is then formed on the insulating layer 21, on the wall 23 of the contact window 22, and on the exposed conductor track 20 inside the contact window 22. The titanium may then be removed from the conductor 20 by means of a usual anisotropic etching treatment or a usual sputter etching treatment. The etching treatment may be stopped the moment this conductor has become exposed, at which moment a thin titanium layer still remains on the surface of the insulating layer 21. The etching treatment may be continued until the titanium layer has been removed both from the insulating layer 21 and from the conductor 20, so that only a titanium layer 24, as shown in FIG. 3, remains on the wall 23 of the contact window 22. This etching treatment, however, is preferably omitted because it involves an additional process step. The thin conductive intermediate layer of titanium, referenced 28 in FIGS. 6 to 9, is accordingly preferably provided not only on the wall 23 of the contact window 22, but also on the insulating layer 21 and on the conductor track 20, said titanium layer being provided on the conductor track to a thickness of at most 10 nm. For the same reason, the aluminum layer referenced 29 in FIGS. 7 to 9 is subsequently also deposited. The titanium layer 28 reacts with aluminum of the layer 29 and of the conductor track 20 at the bottom of the contact window 22 during the heat treatment. Since the titanium layer is less than 10 nm thick there, loose $Al_3Ti$ particles 30 are formed thereby. These particles do not interfere with the growth of the aluminum 26 from the conductor track 20, and the electrical resistance between the conductor track 20 and the aluminum layer 31 deposited on the layer of insulating material 21, in which a next wiring layer is to be formed, is not adversely affected either by the particles 30. The conductor tracks of this wiring layer are formed not only in the second aluminum layer 31, but also in the subjacent aluminum layer 29 and the titanium layer 28.

The second aluminum layer 27, 31, which is deposited on the insulating layer 21 and in which a conductor track is formed which is connected to the conductor track 20 situated below the insulating layer 21 via the contact window 22, is deposited during the heat treatment. Two process steps are thus combined. This has the additional advantage that aluminum is grown into the contact window 21 not only from the conductor track 20 situated below the insulating layer, but also from above during the heat treatment. The contact window is filled more quickly as a result of this. Not only does this provide a saving in time, but the risk of cracks arising in the closed aluminum layer 25, 29 on the wall 23 of the contact window 22 is also reduced thereby.

A time saving is also achieved in that the deposition of the aluminum layer 25, 29 on the wall 23 of the contact window 22 and the deposition of the second aluminum layer are carried out in immediate succession in one and the same reactor chamber. The substrates need not be transferred from one reactor chamber to another. Both depositions are carried out at reduced pressure, so that it is also prevented that a reactor chamber is to be brought to a low pressure twice. At the same time, pollution of the substrates is counteracted.

The heat treatment is carried out in that the semiconductor substrate 2 is heated from its rear side during the deposition of the second aluminum layer 27, 31. FIG. 10 diagrammatically shows a possible temperature gradient of the semiconductor substrate during this heat treatment. After the pressure in the reactor chamber has been reduced to approximately $10^{-7}$ torr, the closed aluminum layer 29 is deposited at a deposition rate of approximately 2 nm/s during the first 10 seconds of the deposition process at a temperature of 50° C. Then the temperature of the semiconductor body is raised to 475° C., for example in approximately 20 seconds, and the temperature is maintained at this level for 40 seconds, during which time the second aluminum layer 31 is deposited at a deposition rate of 10 nm. The deposition of the second aluminum layer proceeds so quickly that the closed aluminum layer on the wall of the contact window will not become cracked. Finally, the semiconductor body is cooled down to room temperature within 40 seconds. Preferably, the increase in the temperature of the semiconductor body is interrupted for 10 to 15 seconds at a temperature of approximately 300° C., whereby the temperature gradient indicated with a broken line in FIG. 10 is approximately realized.

What is claimed is:

1. A method of manufacturing a semiconductor device with a multilayer wiring, comprising: forming an aluminum conductor track on a surface of a semiconductor body, covering the conductor track with a layer of insulating material, forming a contact window in said insulating layer with a wall which reaches down to the conductor track, forming a conductive intermediate layer of titanium on the wall, and carrying out a heat treatment such that aluminum grows from the conductor track into the contact window.

2. A method as claimed in claim 1, wherein the conductive intermediate layer of titanium is provided on the wall of the contact window to a minimum thickness of 1 nm.

3. A method as claimed in claim 2, wherein the conductive intermediate titanium layer is provided not only on the wall of the contact window, but also on the conductor track exposed in the contact window, said titanium layer being provided on the conductor track to a thickness of at most 10 nm.

4. A method as claimed in claim 3, wherein a second aluminum layer is deposited during the heat treatment, in which a conductor track is formed which lies on the insulating layer and which is connected to the conductor track situated below the insulating layer via the contact window.

5. A method as claimed in claim 4, wherein the deposition of the aluminum layer on the wall of the contact window and the deposition of the second aluminum layer are carried out in immediate succession in one and the same reactor chamber.

6. A method as claimed in claim 5, wherein the semiconductor body is heated to a temperature of at most 150 EC during the deposition of the aluminum layer on the wall of the contact window.

7. A method as claimed in claim 6, wherein the temperature of the semiconductor body is increased to a maximum of between 450 EC and 500 EC, preferably within 35 s, immediately after the deposition of the aluminum layer on the wall of the contact window, and this temperature is maintained for a period of 30 to 50 s.closed aluminum layer, which remains closed also during the heat treatment, can be formed on this titanium layer, which can be provided on the wall with a small thickness. The method is accordingly suitable for making semiconductor devices with multilayer wirings having contact windows of 0.5 Fm or smaller and having aspect ratios above 1.

8. A method as claimed in claim 2, wherein a second aluminum layer is deposited during the heat treatment, in which a conductor track is formed which lies on the insulating layer and which is connected to the conductor track situated below the insulating layer via the contact window.

9. A method as claimed in claim 1, wherein a second aluminum layer is deposited during the heat treatment, in which a conductor track is formed which lies on the insulating layer and which is connected to the conductor track situated below the insulating layer via the contact window.

10. A method as claimed in claim 9, wherein the deposition of the aluminum layer on the wall of the contact window and the deposition of the second aluminum layer are carried out in immediate succession in one and the same reactor chamber.

11. A method as claimed in claim 10, wherein the semiconductor body is heated to a temperature of at most 150° C. during the deposition of the aluminum layer on the wall of the contact window.

12. A method as claimed in claim 11, wherein the temperature of the semiconductor body is increased to a maximum of between 450° C. and 500° C., preferably within 35 s, immediately after the deposition of the aluminum layer on the wall of the contact window, and this temperature is maintained for a period of 35 to 50 s.

* * * * *